(12) United States Patent
Haukka et al.

(10) Patent No.: US 9,228,259 B2
(45) Date of Patent: Jan. 5, 2016

(54) METHOD FOR TREATMENT OF DEPOSITION REACTOR

(71) Applicant: ASM IP Holding B.V., Almere (NL)

(72) Inventors: Suvi Haukka, Helsinki (FI); Eric James Shero, Phoenix, AZ (US); Fred Alokozai, Scottsdale, AZ (US); Dong Li, Phoenix, AZ (US); Jereld Lee Winkler, Gilbert, AZ (US); Xichong Chen, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/166,462

(22) Filed: Jan. 28, 2014

(65) Prior Publication Data

US 2014/0220247 A1 Aug. 7, 2014

Related U.S. Application Data

(60) Provisional application No. 61/759,990, filed on Feb. 1, 2013.

(51) Int. Cl.
| | |
|---|---|
| *C23C 16/08* | (2006.01) |
| *C23C 16/18* | (2006.01) |
| *C23C 16/44* | (2006.01) |
| *C23F 1/00* | (2006.01) |
| *C23F 1/08* | (2006.01) |
| *H01L 21/3213* | (2006.01) |

(52) U.S. Cl.
CPC .............. *C23C 16/4404* (2013.01); *C23F 1/00* (2013.01); *C23F 1/08* (2013.01); *H01L 21/32135* (2013.01); *H01L 21/32136* (2013.01)

(58) Field of Classification Search
CPC ................................ C23C 16/08; C23C 16/18
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,054,071 A | 10/1977 | Patejak |
| 4,058,430 A | 11/1977 | Suntola et al. |
| 4,145,699 A | 3/1979 | Hu et al. |

(Continued)

FOREIGN PATENT DOCUMENTS

| | | |
|---|---|---|
| CN | 15634783 A | 1/2005 |
| CN | 101330015 A | 12/2008 |

(Continued)

OTHER PUBLICATIONS

Bearzotti, A., et al., "Fast humidity response of a metal halide-doped novel polymer". Sensors and Actuators B, 7 (1992) 451-454.*

(Continued)

*Primary Examiner* — Bret Chen
(74) *Attorney, Agent, or Firm* — Snell & Wilmer LLP

(57) ABSTRACT

A method for treating a deposition reactor is disclosed. The method removes or mitigates formation of residue in a gas-phase reactor used to deposit doped metal films, such as aluminum-doped titanium carbide films or aluminum-doped tantalum carbide films. The method includes a step of exposing a reaction chamber to a treatment reactant that mitigates formation of species that lead to residue formation.

14 Claims, 5 Drawing Sheets

(56) References Cited

U.S. PATENT DOCUMENTS

| | | | |
|---|---|---|---|
| 4,176,630 A | 12/1979 | Elmer | |
| 4,181,330 A | 1/1980 | Kojima | |
| 4,194,536 A | 3/1980 | Stine et al. | |
| 4,322,592 A | 3/1982 | Martin | |
| 4,389,973 A | 6/1983 | Suntola et al. | |
| 4,393,013 A | 7/1983 | McMenamin | |
| 4,436,674 A | 3/1984 | McMenamin | |
| 4,499,354 A | 2/1985 | Hill et al. | |
| 4,512,113 A | 4/1985 | Budinger | |
| 4,570,328 A | 2/1986 | Price et al. | |
| D288,556 S | 3/1987 | Wallgren | |
| 4,653,541 A | 3/1987 | Oehlschlaeger et al. | |
| 4,722,298 A | 2/1988 | Rubin et al. | |
| 4,735,259 A | 4/1988 | Vincent | |
| 4,753,192 A | 6/1988 | Goldsmith et al. | |
| 4,789,294 A | 12/1988 | Sato et al. | |
| 4,821,674 A | 4/1989 | deBoer et al. | |
| 4,827,430 A | 5/1989 | Aid et al. | |
| 4,882,199 A * | 11/1989 | Sadoway et al. | 216/37 |
| 4,986,215 A | 1/1991 | Yamada | |
| 4,991,614 A | 2/1991 | Hammel | |
| 5,062,386 A | 11/1991 | Christensen | |
| 5,074,017 A | 12/1991 | Toya et al. | |
| 5,119,760 A | 6/1992 | McMillan et al. | |
| 5,167,716 A | 12/1992 | Boitnott et al. | |
| 5,199,603 A | 4/1993 | Prescott | |
| 5,221,556 A | 6/1993 | Hawkins et al. | |
| 5,242,539 A | 9/1993 | Kumihashi et al. | |
| 5,243,195 A | 9/1993 | Nishi | |
| 5,326,427 A | 7/1994 | Jerbic | |
| 5,380,367 A | 1/1995 | Bertone | |
| 5,421,893 A | 6/1995 | Perlov | |
| 5,422,139 A | 6/1995 | Shinriki et al. | |
| 5,518,549 A | 5/1996 | Hellwig | |
| 5,595,606 A | 1/1997 | Fujikawa et al. | |
| 5,616,947 A | 4/1997 | Tamura | |
| 5,632,919 A | 5/1997 | MacCracken et al. | |
| 5,681,779 A * | 10/1997 | Pasch et al. | 438/642 |
| 5,695,567 A | 12/1997 | Kordina | |
| 5,730,801 A | 3/1998 | Tepman | |
| 5,732,744 A | 3/1998 | Barr et al. | |
| 5,736,314 A | 4/1998 | Hayes et al. | |
| 5,796,074 A | 8/1998 | Edelstein et al. | |
| 5,836,483 A | 11/1998 | Disel | |
| 5,837,320 A * | 11/1998 | Hampden-Smith et al. | 427/248.1 |
| 5,855,680 A | 1/1999 | Soininen et al. | |
| 5,920,798 A * | 7/1999 | Higuchi et al. | 438/761 |
| 5,979,506 A | 11/1999 | Aarseth | |
| 6,013,553 A | 1/2000 | Wallace et al. | |
| 6,015,465 A | 1/2000 | Kholodenko et al. | |
| 6,035,101 A | 3/2000 | Sajoto et al. | |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,122,036 A | 9/2000 | Yamasaki et al. | |
| 6,125,789 A | 10/2000 | Gupta et al. | |
| 6,129,044 A | 10/2000 | Zhao et al. | |
| 6,148,761 A | 11/2000 | Majewski et al. | |
| 6,160,244 A | 12/2000 | Ohashi | |
| 6,161,500 A | 12/2000 | Kopacz et al. | |
| 6,201,999 B1 | 3/2001 | Jevtic | |
| 6,274,878 B1 | 8/2001 | Li et al. | |
| 6,287,965 B1 | 9/2001 | Kang et al. | |
| 6,302,964 B1 | 10/2001 | Umotoy et al. | |
| 6,312,525 B1 | 11/2001 | Bright et al. | |
| D451,893 S | 12/2001 | Robson | |
| D452,220 S | 12/2001 | Robson | |
| 6,326,597 B1 | 12/2001 | Lubomirsky et al. | |
| 6,342,427 B1 | 1/2002 | Choi et al. | |
| 6,367,410 B1 | 4/2002 | Leahey et al. | |
| 6,368,987 B1 | 4/2002 | Kopacz et al. | |
| 6,383,566 B1 * | 5/2002 | Zagdoun | 427/255.15 |
| 6,410,459 B2 | 6/2002 | Blalock et al. | |
| 6,420,279 B1 | 7/2002 | Ono et al. | |
| 6,454,860 B2 | 9/2002 | Metzner et al. | |
| 6,478,872 B1 | 11/2002 | Chae et al. | |
| 6,482,331 B2 | 11/2002 | Lu et al. | |
| 6,483,989 B1 | 11/2002 | Okada et al. | |
| 6,511,539 B1 | 1/2003 | Raaijmakers | |
| 6,521,295 B1 * | 2/2003 | Remington, Jr. | 427/255.19 |
| 6,534,395 B2 | 3/2003 | Werkhoven et al. | |
| 6,569,239 B2 | 5/2003 | Arai et al. | |
| 6,579,833 B1 | 6/2003 | McNallan et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,633,364 B2 | 10/2003 | Hayashi | |
| 6,645,304 B2 | 11/2003 | Yamaguchi | |
| 6,648,974 B1 | 11/2003 | Ogliari et al. | |
| 6,673,196 B1 | 1/2004 | Oyabu | |
| 6,682,973 B1 | 1/2004 | Paton et al. | |
| 6,709,989 B2 | 3/2004 | Ramdani et al. | |
| 6,710,364 B2 | 3/2004 | Guldi et al. | |
| 6,734,090 B2 | 5/2004 | Agarwala et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,847,014 B1 | 1/2005 | Benjamin et al. | |
| 6,858,524 B2 | 2/2005 | Haukka et al. | |
| 6,858,547 B2 | 2/2005 | Metzner | |
| 6,863,019 B2 | 3/2005 | Shamouilian | |
| 6,874,480 B1 | 4/2005 | Ismailov | |
| 6,875,677 B1 | 4/2005 | Conley, Jr. et al. | |
| 6,884,066 B2 | 4/2005 | Nguyen et al. | |
| 6,884,319 B2 | 4/2005 | Kim | |
| 6,889,864 B2 | 5/2005 | Lindfors et al. | |
| 6,909,839 B2 | 6/2005 | Wang et al. | |
| 6,930,059 B2 | 8/2005 | Conley, Jr. et al. | |
| 6,935,269 B2 | 8/2005 | Lee et al. | |
| 6,955,836 B2 | 10/2005 | Kumagai et al. | |
| 6,972,478 B1 | 12/2005 | Waite et al. | |
| 7,045,430 B2 | 5/2006 | Ahn et al. | |
| 7,053,009 B2 | 5/2006 | Conley, Jr. et al. | |
| 7,071,051 B1 | 7/2006 | Jeon et al. | |
| 7,115,838 B2 | 10/2006 | Kurara et al. | |
| 7,122,085 B2 | 10/2006 | Shero et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,195,693 B2 | 3/2007 | Cowans | |
| 7,204,887 B2 | 4/2007 | Kawamura et al. | |
| 7,205,247 B2 | 4/2007 | Lee et al. | |
| 7,235,501 B2 | 6/2007 | Ahn et al. | |
| 7,238,596 B2 | 7/2007 | Kouvetakis et al. | |
| D553,104 S | 10/2007 | Oohashi et al. | |
| 7,298,009 B2 | 11/2007 | Yan et al. | |
| D557,226 S | 12/2007 | Uchino et al. | |
| 7,312,494 B2 | 12/2007 | Ahn et al. | |
| 7,329,947 B2 | 2/2008 | Adachi et al. | |
| 7,357,138 B2 | 4/2008 | Ji et al. | |
| 7,393,418 B2 | 7/2008 | Yokogawa | |
| 7,393,736 B2 | 7/2008 | Ahn et al. | |
| 7,402,534 B2 | 7/2008 | Mahajani | |
| 7,405,166 B2 | 7/2008 | Liang et al. | |
| 7,405,454 B2 | 7/2008 | Ahn et al. | |
| 7,414,281 B1 | 8/2008 | Fastow | |
| 7,431,966 B2 | 10/2008 | Derderian et al. | |
| 7,437,060 B2 | 10/2008 | Wang et al. | |
| 7,442,275 B2 | 10/2008 | Cowans | |
| 7,489,389 B2 | 2/2009 | Shibazaki | |
| D593,969 S | 6/2009 | Li | |
| 7,547,363 B2 | 6/2009 | Tomiyasu et al. | |
| 7,575,968 B2 | 8/2009 | Sadaka et al. | |
| 7,589,003 B2 | 9/2009 | Kouvetakis et al. | |
| 7,601,223 B2 | 10/2009 | Lindfors et al. | |
| 7,601,225 B2 | 10/2009 | Tuominen et al. | |
| 7,640,142 B2 | 12/2009 | Tachikawa et al. | |

(56) References Cited

U.S. PATENT DOCUMENTS

| | | |
|---|---|---|
| 7,651,583 B2 | 1/2010 | Kent et al. |
| D609,655 S | 2/2010 | Sugimoto |
| 7,678,197 B2 | 3/2010 | Maki |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,838,084 B2 | 11/2010 | Derderian et al. |
| 7,851,019 B2 | 12/2010 | Tuominen et al. |
| 7,884,918 B2 | 2/2011 | Hattori |
| D634,719 S | 3/2011 | Yasuda et al. |
| 8,041,197 B2 | 10/2011 | Kasai et al. |
| 8,055,378 B2 | 11/2011 | Numakura |
| 8,071,451 B2 | 12/2011 | Uzoh |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,323,413 B2 | 12/2012 | Son |
| 8,367,528 B2 | 2/2013 | Bauer et al. |
| 8,372,204 B2 | 2/2013 | Nakamura |
| 8,444,120 B2 | 5/2013 | Gregg et al. |
| 8,506,713 B2 | 8/2013 | Takagi |
| D691,974 S | 10/2013 | Osada et al. |
| 8,608,885 B2 | 12/2013 | Goto et al. |
| 8,683,943 B2 | 4/2014 | Onodera et al. |
| 8,711,338 B2 | 4/2014 | Liu et al. |
| D705,745 S | 5/2014 | Kurs et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| D716,742 S | 11/2014 | Jang et al. |
| 8,877,655 B2 | 11/2014 | Shero et al. |
| 8,883,270 B2 | 11/2014 | Shero et al. |
| 8,986,456 B2 | 3/2015 | Fondurulia et al. |
| 8,993,054 B2 | 3/2015 | Jung et al. |
| 9,005,539 B2 | 4/2015 | Halpin et al. |
| 9,017,481 B1 | 4/2015 | Pettinger et al. |
| 9,018,111 B2 | 4/2015 | Milligan et al. |
| 9,021,985 B2 | 5/2015 | Alokozai et al. |
| 9,029,253 B2 | 5/2015 | Milligan et al. |
| 9,096,931 B2 | 8/2015 | Yednak et al. |
| 2001/0017103 A1* | 8/2001 | Takeshita et al. .............. 118/50 |
| 2001/0046765 A1* | 11/2001 | Cappellani et al. ........... 438/627 |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0094133 A1 | 5/2003 | Yoshidome et al. |
| 2003/0111963 A1 | 6/2003 | Tolmachev et al. |
| 2003/0141820 A1 | 7/2003 | White et al. |
| 2003/0168001 A1 | 9/2003 | Sneh |
| 2003/0180458 A1 | 9/2003 | Sneh |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0036129 A1 | 2/2004 | Forbes et al. |
| 2004/0077182 A1 | 4/2004 | Lim et al. |
| 2004/0101622 A1 | 5/2004 | Park et al. |
| 2004/0106249 A1 | 6/2004 | Huotari |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0123690 A1 | 6/2005 | Derderian et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2005/0287725 A1 | 12/2005 | Kitagawa |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068125 A1 | 3/2006 | Radhakrishnan |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0163612 A1 | 7/2006 | Kouvetakis et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kuppurao et al. |

(56) References Cited

U.S. PATENT DOCUMENTS

| | | |
|---|---|---|
| 2007/0049053 A1 | 3/2007 | Mahajani |
| 2007/0059948 A1 | 3/2007 | Metzner et al. |
| 2007/0065578 A1* | 3/2007 | McDougall ............... 427/248.1 |
| 2007/0066010 A1 | 3/2007 | Ando |
| 2007/0054405 A1 | 4/2007 | Kim |
| 2007/0077355 A1 | 4/2007 | Chacin et al. |
| 2007/0096194 A1 | 5/2007 | Streck et al. |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0163440 A1 | 7/2007 | Kim et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0237697 A1 | 10/2007 | Clark |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1 | 4/2010 | Ganguli et al. |
| 2010/0124610 A1 | 5/2010 | Aikawa et al. |
| 2010/0130017 A1 | 5/2010 | Luo et al. |
| 2010/0162752 A1 | 7/2010 | Tabata et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0089469 A1 | 4/2011 | Merckling |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1* | 10/2012 | Pore et al. ...................... 438/658 |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0318334 A1 | 12/2012 | Bedell et al. |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1* | 5/2013 | Lu et al. .......................... 427/535 |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2013/0330911 A1 | 12/2013 | Huang et al. |
| 2014/0000843 A1 | 1/2014 | Dunn et al. |
| 2014/0014644 A1 | 1/2014 | Akiba et al. |
| 2014/0020619 A1 | 1/2014 | Vincent et al. |
| 2014/0027884 A1 | 1/2014 | Fang et al. |
| 2014/0036274 A1 | 2/2014 | Marquardi et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1* | 1/2015 | Thompson et al. ........... 427/253 |
| 2015/0014632 A1 | 1/2015 | Kim et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0132212 A1 | 5/2015 | Winkler et al. |
| 2015/0140210 A1 | 5/2015 | Jung et al. |
| 2015/0147877 A1 | 5/2015 | Jung |
| 2015/0167159 A1 | 6/2015 | Halpin et al. |
| 2015/0184291 A1 | 7/2015 | Alokozai et al. |
| 2015/0187568 A1 | 7/2015 | Pettinger et al. |

FOREIGN PATENT DOCUMENTS

| | | |
|---|---|---|
| CN | 101522943 | 9/2009 |
| CN | 101423937 | 9/2011 |
| EP | 2036600 | 3/2009 |

(56) References Cited

FOREIGN PATENT DOCUMENTS

| | | |
|---|---|---|
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 1226380 | 1/2005 |
| TW | 200701301 A | 1/2007 |
| WO | 2006/056091 A1 | 6/2006 |
| WO | 2006/078666 | 7/2006 |

OTHER PUBLICATIONS

Varma, Indra K., et al., "Effect of Metal Halides on Thermal, Mechanical, and Electrical Properties of Polypyromellitimide Films". Journal of Applied Polymer Science, vol. 32, 3987-4000 (1986).*
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Office Action dated Apr. 23, 2013 in U.S. Appl. No. 12/763,037.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Office Action dated Jun. 28, 2013 in U.S. Appl. No. 12/754,223.
USPTO; Final Office Action dated Feb. 25, 2014 in U.S. Appl. No. 12/754,223.
USPTO; Office Action dated Apr. 23, 2013 in U.S. Appl. No. 12/765,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 13/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Office Action dated Mar. 28, 2013 in U.S. Appl. No. 13/283,408.
USPTO; Final Office Action dated Dec. 11, 2013 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HiLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4. Department of Materials Science and Engineering, Pohang University of Science and Technology, Pohang, Korea.
Novaro et al., Theoretical Study on a Reaction Pathway of Ziegler-Natta-Type Catalysis J. Chem. Phys. 68(5), Mar. 1, 1978 p. 2337-2351.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO; Final Office Action dated Jul. 8, 2014 in U.S. Appl. No. 13/439,528.

(56) References Cited

OTHER PUBLICATIONS

USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in Application No. 13/612,538.
USPTO; Non-Final Office Action dated Jun. 2, 2014 in Application No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
USPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 19, 2014 in U.S. Appl. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTal-xN Alloys of Rocksalt Structure. Journal of Applied Physics, 100, pp. 043535-1-043535-6, (2011).
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Final Office Action dated Aug. 12, 2015 in U.S. Appl. No. 12/754,223.
USPTO; Non-Final Office Action dated Jun. 17, 2015 in U.S. Appl. No. 13/283,408.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor depostion, atomic layer deposition, and related technologies," Journal of Vacuum Science & Technology A 21.5, (2003), S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).

\* cited by examiner

METHOD FOR TREATMENT OF DEPOSITION REACTOR

FIELD OF INVENTION

The disclosure generally relates to methods and systems for treating deposition reactors. More particularly, exemplary embodiments of the present disclosure relate to methods and systems for mitigating or removing buildup in gas-phase deposition reactors.

BACKGROUND OF THE DISCLOSURE

Doped metal films, e.g., doped metal carbides, nitrides, borides, and silicides, such as aluminum-doped metal carbides, may be used for a variety of applications. For example, aluminum-doped titanium carbide and similar materials may be used for gate electrodes in metal oxide field effect transistors (MOSFETs) or insulated gated field effect transistors (IGFETs), such as complementary metal oxide semiconductor (CMOS) devices, as a barrier layer or fill material for semiconductor or similar electronic devices, or as coatings in other applications.

When used as a layer of an electronic device or as a coating, the doped metal films are typically deposited using gas-phase deposition techniques, such as chemical vapor deposition techniques, including atomic layer deposition. Precursors for the gas-phase deposition often include an organometallic compound (e.g., including aluminum) and a metal halide compound (e.g., including titanium or tantalum). Unfortunately, a decomposition temperature of the organometallic compound can be much lower (e.g., more than 200° C. lower) than the temperature of formation of the desired doped metal film. As a result, precursor decomposition products or residue may form in the deposition reaction chamber during a deposition process. The residue may, in turn, create particles, which result in defects in layers deposited using the reactor. In addition, some of the decomposition products may undergo polymerization in the presence of the metal halide compound, and the polymerization products may result in additional defects in the deposited layers. A number of defects within a deposited layer generally correlates to an amount of material deposited within the reactor; the number of defects within a layer generally increases as a number of deposition runs or amount of material deposited increases.

To mitigate the number of defects in the deposited layer, the reactor may be purged with an inert gas for an extended period of time, on the order of hours, after a certain amount of material is deposited or a number of substrates have been processed. This extended purge process significantly reduces the throughput of the deposition reactor and increases the cost of operation of the reactor.

Accordingly, improved methods and systems for treating a deposition reactor to reduce or mitigate particle formation—such as particles resulting from buildup of precursor decomposition products of materials used to deposit doped metal films—are desired.

SUMMARY OF THE DISCLOSURE

Various embodiments of the present disclosure provide an improved method and system for removing or mitigating the formation of residue in a deposition reactor or otherwise transforming the residue, such that it generates fewer particles. More particularly, exemplary systems and methods mitigate formation of, transform, or remove residue resulting from the use of one or more precursors used in the deposition of doped metal films, such as metal films including carbon, boron, silicon, nitrogen, aluminum, or any combination thereof, in a gas-phase deposition reactor. While the ways in which the various drawbacks of the prior art are discussed in greater detail below, in general, the method and system use a gas-phase reactant to mitigate the formation of, transform, or remove unwanted residue within a reactor chamber. By mitigating the formation of, transforming, or removing the unwanted residue, fewer particles are formed within the reactor and thus fewer defects are formed within deposited films. In addition, substrate throughput of the reactor is increased and the cost of operating the reactor is decreased.

In accordance with various embodiments of the disclosure, a method of treating a reactor includes the steps of providing a metal halide chemistry to a reaction chamber of the deposition reactor, providing a metal CVD precursor selected from the group consisting of organometallic compound chemistry and aluminum CVD compound chemistry to the reaction chamber, forming a doped metal film, providing a treatment reactant chemistry to the reaction chamber, exposing the reaction chamber to the treatment reactant chemistry to mitigate particle formation of particles comprising decomposition products of the metal CVD precursor (e.g., by mitigating residue buildup or by transforming the residue to material that is less likely to form particles within the reactor), and purging the reaction chamber. Deposition steps of the method may be repeated to deposit a desired amount of doped metal film or process a desired number of substrates and then treat then reactor with the treatment reactant. In accordance with exemplary aspects of these embodiments, the treatment reactant source comprises a compound selected from the group consisting of compounds comprising one or more hydrogen atoms and compounds comprising a halogen (e.g., chlorine, HCl). In accordance with various aspects, the treatment reactant source comprises a compound selected from the group consisting of ammonia, hydrogen, silane, methane, silicon hydrides, boron hydrides, halosilanes, haloboranes, alkenes (e.g., ethylene), alkynes, and hydrazine and its derivatives, such as alkyl hydrazines etc. And, in accordance with yet further aspects, the treatment reactant source comprises a decomposition product of the metal CVD source. The treatment reactant may be exposed to remote or direct thermal or plasma activation to form activated species.

In accordance with further exemplary embodiments of the disclosure, a system for treating a deposition reactor includes a reactor comprising a reaction chamber, a metal halide source fluidly coupled to the reactor, a metal CVD source selected from the group consisting of one or more of organometallic compounds and aluminum CVD compounds fluidly coupled to the reactor, a treatment reactant source coupled to the reactor, and a vacuum pump coupled to the reactor. The system may include direct or remote plasma and/or thermal excitation devices to provide activated reactant species to the reaction chamber. In accordance with exemplary aspects of these embodiments, the treatment reactant source comprises a compound selected from the group consisting of compounds comprising one or more hydrogen atoms and compounds comprising a halogen (e.g., chlorine, HCl). In accordance with various aspects, the treatment reactant source comprises a compound selected from the group consisting of ammonia, hydrogen, silane, methane, silicon hydrides, boron hydrides, halosilanes, haloboranes, alkenes (e.g., ethylene), alkynes, and hydrazine and its derivatives, such as alkyl hydrazines etc. And, in accordance with yet further aspects, the treatment reactant source comprises a decomposition product of the metal CVD source.

In accordance with yet additional embodiments of the invention, a method of treating a deposition reactor includes the steps of providing a metal halide chemistry to a reaction chamber for a period of time, after the step of providing a metal halide chemistry to a reaction chamber for a period of time, providing a treatment reactant chemistry to the reaction chamber for a period of time, and during or after providing a treatment reactant chemistry to the reaction chamber for a period of time, providing a metal CVD precursor chemistry to the reaction chamber to form a layer of doped metal. In this case, particle formation is mitigated (e.g., via mitigation of residue formation or via densification of the residue) during the deposition step and any residue that forms may be removed during and optionally after the deposition process. The treatment reactant may be introduced with the metal CVD precursor chemistry or before the introduction of the metal CVD precursor. In accordance with exemplary aspects of these embodiments, a treatment reactant chemistry comprises one or more of hydrogen compounds including one or more hydrogen atoms (e.g., hydrogen, HCl, silane, methane, ethylene, and the like) and compounds including a halogen (e.g., chlorine, HCl). The treatment reactant may be exposed to remote or direct thermal or plasma activation to form activated species. In accordance with additional aspects of these embodiments, the step of providing a treatment reactant chemistry to the reaction chamber includes providing a source of a decomposition product of the organometallic compounds or the aluminum CVD compounds.

Both the foregoing summary and the following detailed description are exemplary and explanatory only and are not restrictive of the disclosure or the claimed invention.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS OF THE INVENTION

The description of exemplary embodiments of methods and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The method and system described herein can be used to mitigate formation of, remove, and/or transform residue in a reactor used to deposit doped metal films (e.g., films including carbon, boron, silicon, and/or nitrogen) that otherwise buildups and/or generates particles during a deposition process. Use of the methods and systems described herein results in a reduction of particle formation from residue and therefore results in higher throughput and in a lower cost of operation of deposition reactors, compared to reactors that are merely purged after similar deposition processes.

Figure 1:
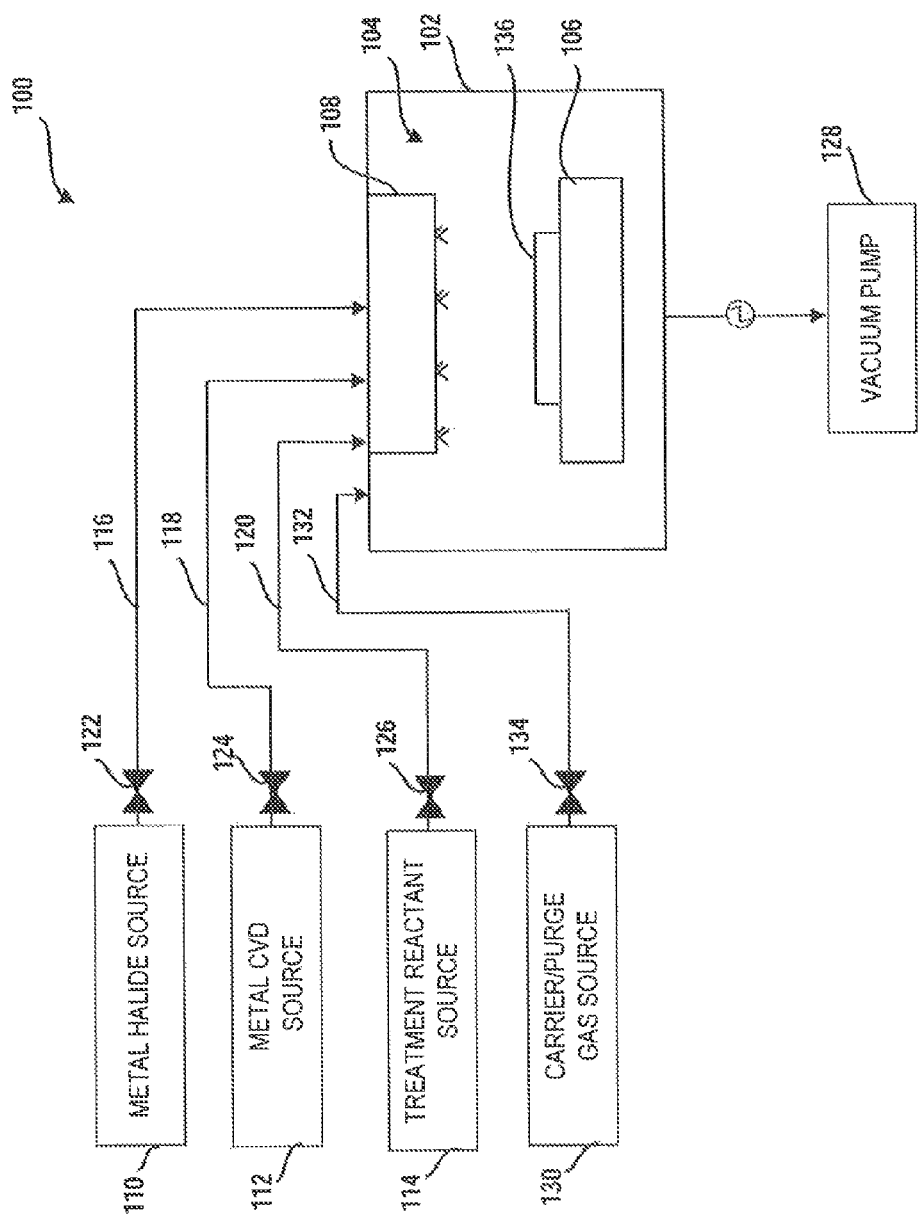
FIG. 1 illustrates a system in accordance with various exemplary embodiments of the disclosure.

Turning now to FIG. 1, a system 100, for mitigating deposition residue buildup, as described herein, is illustrated. System 100 includes a reactor 102, including a reaction chamber 104, a substrate holder 106, and a gas distribution system 108; a metal halide source 110; a metal chemical vapor deposition (CVD) source 112; a treatment reactant source 114; lines 116, 118, 120 connecting sources 110-114 to reactor 102; valves 122, 124 and 126 interposed between the sources 110-114 and reactor 102; a vacuum pump 128, and optionally a carrier and/or purge gas source 130 coupled to reactor 102 via line 132 and valve 134.

Reactor 102 may be a standalone reactor or part of a cluster tool. Further, reactor 102 may be dedicated to doped metal deposition and treatment processes as described herein, or reactor 102 may be used for other processes—e.g., for other layer deposition and/or etch processing. For example, reactor 102 may include a reactor typically used for physical vapor deposition (PVD), chemical vapor deposition (CVD), and/or atomic layer deposition (ALD) processing, and may include remote or direct thermal excitation, direct plasma, and/or remote plasma apparatus. Using thermal or plasma activation apparatus during a deposition or treatment process creates excited molecules or species from one or more of sources 110-114 to enhance the reactivity of the reactants from sources 110-114. By way of one example, reactor 102 includes a reactor suitable for ALD deposition. An exemplary ALD reactor suitable for system 100 is described in U.S. Pat. No. 8,152,922, the contents of which are hereby incorporated herein by reference, to the extent such contents do not conflict with the present disclosure.

Substrate holder 106 is designed to hold a substrate or workpiece 136 in place during processing. In accordance with various exemplary embodiments, holder 106 may form part of a direct plasma circuit. Additionally or alternatively, holder 106 may be heated, cooled, or be at ambient process temperature during processing.

Although gas distribution system 108 is illustrated in block form, gas distribution system 108 may be relatively complex and be designed to mix vapor (gas) from sources 110 and/or 112 and carrier/purge gas from one or more sources, such as gas source 130, prior to distributing the gas mixture to remainder of reactor 102. Further, system 108 may be configured to provide vertical (as illustrated) or horizontal flow of gasses to the chamber 104. An exemplary gas distribution system is described in U.S. Pat. No. 8,152,922. By way of example, distribution system 108 may include a showerhead.

Metal halide source 110 includes one or more gases, or materials that become gaseous, that include a metal and a halide. Exemplary metals include titanium, tantalum, and niobium. Exemplary halides include chlorine and bromine. Source 110 may include, for example, titanium chloride (e.g., $TiCl_4$), tantalum chloride (e.g., $TaCl_5$), and niobium chloride (e.g.,$NbCl_5$). Gas from source 110 may be exposed to a thermal and/or remote plasma and/or direct plasma source to form activated or excited species, such as ions and/or radicals including one or more of chlorine, titanium, tantalum, and niobium. The term "activated species" includes the precursor and any ions and/or radicals than may form during exposure of the precursor to any thermal and/or plasma process. Further, the term "chemistry," when used in connection with a compound, includes the compound and any activated specie(s), whether or not the compound (e.g., a reactant) has been exposed to thermal or plasma activation.

Metal CVD source 112 includes one or more gases, or materials that become gaseous, that react with or form reactive species that react with compounds or species from metal halide source 110 to form a deposited layer of metal-doped film, such as a layer of aluminum-doped titanium carbide or aluminum-doped tantalum carbide, other carbines, nitride, silicides, or borides. Metal CVD source 112 may include, for example, organometallic compounds and/or aluminum CVD compounds, such as alane compounds. Exemplary suitable organometallic compounds include trimethylaluminum (TMA), triethylaluminum (TEA), triisobutylaluminum (TIBA), diethylaluminum chloride (DEACL), diethylaluminum hydride (DMAH), and tritertiarybutylaluminum (TTBA). Exemplary aluminum CVD alane compounds include trimethylamine alane (TMAA), triethylamine alane (TEAA), dimethyl ethylamine alane (DMEAA), trimethylaminealane borane (TMAAB), and methylpyrrolidine alane (MPA).

Use of organometallic compounds and alane compounds may be advantageous, because such compounds allow for atomic layer deposition, which allows, precise, conformal, self-limiting deposition of layers of desired material. However, the organic precursors are susceptible to decomposition at or below film deposition temperatures. Indeed, some of the precursors decompose at temperatures 200° C. (or more) less than the temperature of formation of the film. As a result, the compounds may decompose into undesired products prior to reaching substrate 136, resulting in residue formation within chamber 104—for example at or near gas distribution system 108, such as a showerhead. As noted above, the residue formation may, in turn lead to particle formation, which causes defects in the deposited metal films.

For example, many of the organometallic compounds may undergo a beta-hydride elimination reaction, in which an alkyl group bonded to a metal center is converted into a corresponding meta(hydride and an alkene compound. The formation of the alkene compound, particularly at or near gas distribution system 108, can result in residue buildup, which includes organic and inorganic materials. In addition, the decomposition products can polymerize, e.g., in the presence of species from metal halide source 110, Which may result in additional or alternative residue formation.

Gas from source 112 may be exposed to a thermal and/or a direct plasma source and/or a remote plasma source to form activated species, such as ions and/or radicals.

Treatment reactant source 114 includes one or more gases, or materials that become gaseous, that include a compound or species that mitigates formation of residue within a reactor and/or that transforms the residue in a manner that generates less particles—e.g., by densifying the residue. Exemplary compounds and species can react with a halogen on a halogen (e.g., Cl)-terminated molecule (e.g., on a deposited film) to mitigate formation of undesired decomposition products. Treatment reactant source 114 may include, for example, a compound selected from the group consisting of compounds comprising one or more hydrogen atoms and compounds comprising a halogen (e.g., chlorine, HCl). In accordance with various aspects, the treatment reactant source comprises a compound selected from the group consisting of ammonia, hydrogen, silane, methane, silicon hydrides, boron hydrides, halosilanes, haloboranes, alkenes (e.g., ethylene), alkynes, and hydrazine and its derivatives, such as alkyl hydrazines etc. And, in accordance with yet further aspects, the treatment reactant source comprises a decomposition product of the metal CVD source, e.g., a beta hydride elimination product of the metal CVD source.

Gas from source 114 may be exposed to a thermal and/or a remote plasma and/or a direct plasma source to form activated or excited species, such as ions and/or radicals including one or more of hydrogen and/or chlorine and/or other activated species.

Carrier or inert source 130 includes one or more gases, or materials that become gaseous, that are relatively unreactive in reactor 102. Exemplary carrier and inert gasses include nitrogen, argon, helium, and any combinations thereof.

Figure 2:
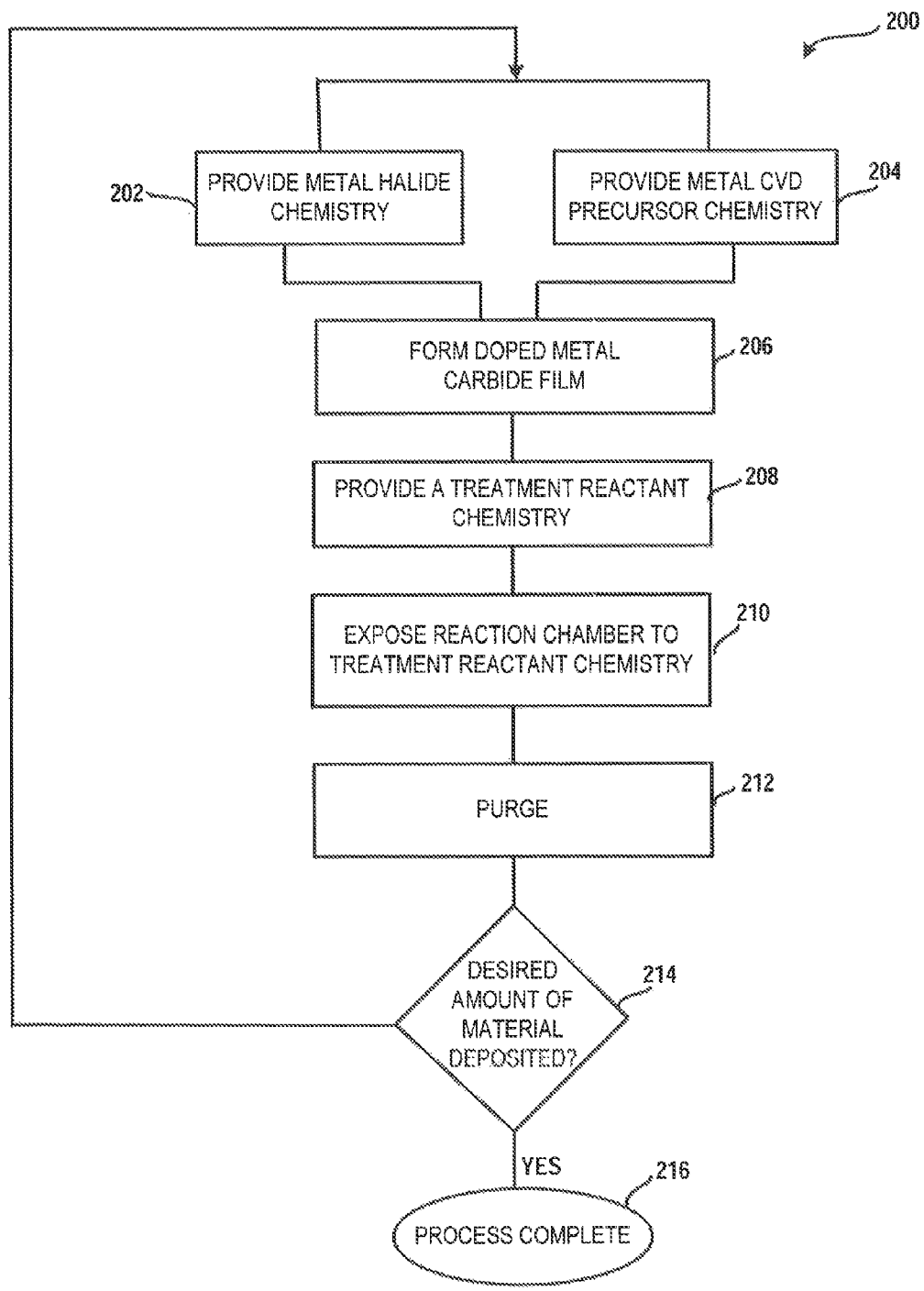
FIG. 2 illustrates a method in accordance with exemplary embodiments of the disclosure.

FIG. 2 illustrates a method 200 of treating a reactor in accordance with exemplary embodiments of the disclosure. Method 200 includes the steps of: providing a metal halide chemistry (step 202), providing a metal CVD precursor chemistry (step 204), forming a doped metal film (step 206), providing a treatment reactant chemistry (step 208), exposing the reaction chamber to the treatment reactant chemistry (step 210), optionally purging the reactor (step 212), and, if the desired amount of material has not been deposited (step 214), repeating steps 202-212, and if the desired amount of material has been deposited (step 214), the process is complete (step 216). Although not separately illustrated, a substrate or workpiece may be removed from the reaction chamber before treatment step 210, such that the film on the workpiece is not exposed to the treatment reactant chemistry. Alternatively, the substrate may be exposed to the treatment reactant chemistry.

Step 202 includes providing metal halide chemistry to a reaction chamber and step 204 includes providing a metal CVD precursor chemistry to a reaction chamber. Steps 202 and 204 may be performed in any order or be performed simultaneously. Further, although illustrated with only two reactant sources, exemplary methods may include the use of more than two reactants.

The metal halide chemistry may include any of the compounds described above in connection with metal halide source 110. During step 202, the metal halide source may be exposed to a thermal activation process and/or a remote and/or direct plasma source to create metal halide source chemistry that includes activate species. Similarly, the metal CVD precursor may include any compound noted above in connection with metal CVD source 112. And, during step 204, the metal CVD precursor may be exposed to a thermal activation process and/or a remote and/or direct plasma source to create metal CVD source chemistry including activated species.

During step 206, a metal film is formed. The metal film may include, for example, aluminum, silicon, and/or boron doped titanium carbide, aluminum, silicon, and/or boron doped tantalum carbide, and/or aluminum, silicon, and/or boron doped niobium carbide, or other metal films including one or more of C, Si, B, or N.

During step 208, a treatment reactant chemistry to mitigate formation of residue and/or to densify the residue and/or to transform the residue to form fewer particles within a reaction chamber is introduced into the reaction chamber. The reactant chemistry may include any of the compounds noted above in connection with treatment reactant source 114, and the reactant from a source may be exposed to thermal and/or plasma activation as described herein to form treatment reactant chemistry including activated species.

By way of examples, the treatment reactant chemistry may include hydrogen gas, and the hydrogen gas may be introduced to a reaction chamber (e.g., chamber 104) via a gas distribution system (e.g., system 108). Additionally or alternatively, hydrogen gas may be exposed to a remote plasma to form treatment reactant chemistry including activated species, such as hydrogen radicals. In accordance with exemplary aspects, the remote plasma is configured, such that the activated species can reach and react with material on the surface of the gas distribution system (e.g., a showerhead), as well as within holes of the system near the surface. In addition or as an alternative, step 208 may include providing a halogen, such as chlorine, or a halogen activate species, such as chlorine radicals, to the reaction chamber to mitigate formation of residue within the reaction chamber.

In accordance with other embodiments, the treatment reactant chemistry includes ammonia, which may or may not by subjected to thermal and/or direct and/or remote plasma activation as described herein. The ammonia is thought to react with a halogen (e.g., chlorine)-terminated surface of deposited material and mitigate formation of decomposition products within a reaction chamber.

Exemplary conditions for an ammonium residue reactant process include depositing about 1250 Å carbide, followed by a 10 min exposure of $NH_3$, followed by a 20 min purge (remove residue $NH_3$), followed by depositing about 1250 Å carbide, followed by about 10 min exposure of $NH_3$, followed by about 20 min purge (remove residue $NH_3$). The 1250 Å carbide may be deposited onto, for example, 25 wafers at 50 Å each (one lot of wafers).

It is thought that this process transforms the residue in the reactor to provide better adhesion, lowering stress or even making it less susceptible to oxidation to prevent this residual film from breaking off the reactor surface and landing on the wafer-thus reducing on wafer defect levels.

Although illustrated as including a decision or determination step 214, method 200 may be configured to automatically run a predetermined number of cycles of steps 202-212. For example, method 200 may be configured to run 1, 2, 3, 4, 5, or 50 number of cycles of steps 202-212 and complete (step 216) upon the conclusion of step 208 of the last cycle. Alternatively, steps 202-212 may be repeated based until a predetermined amount of doped metal film is deposited. For example, the steps 202-212 may be run until an accumulated film thickness of about 20 Å to about 1250 Å or about 5 Å to about 5000 Å is reached.

Figure 4:
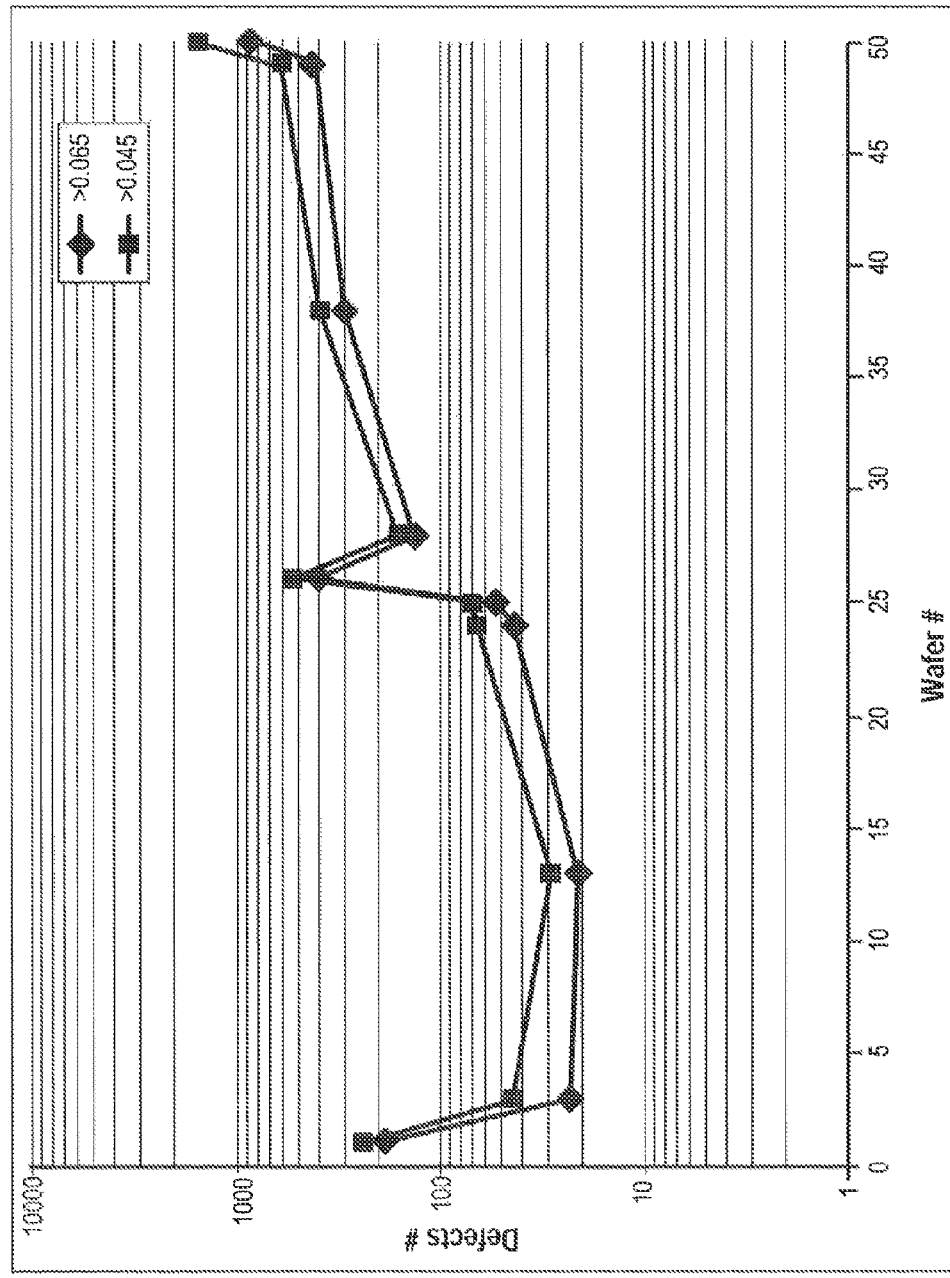
FIG. 4 illustrates a number of defects on a substrate based on a number of substrates processed with no treatment.
Figure 5:
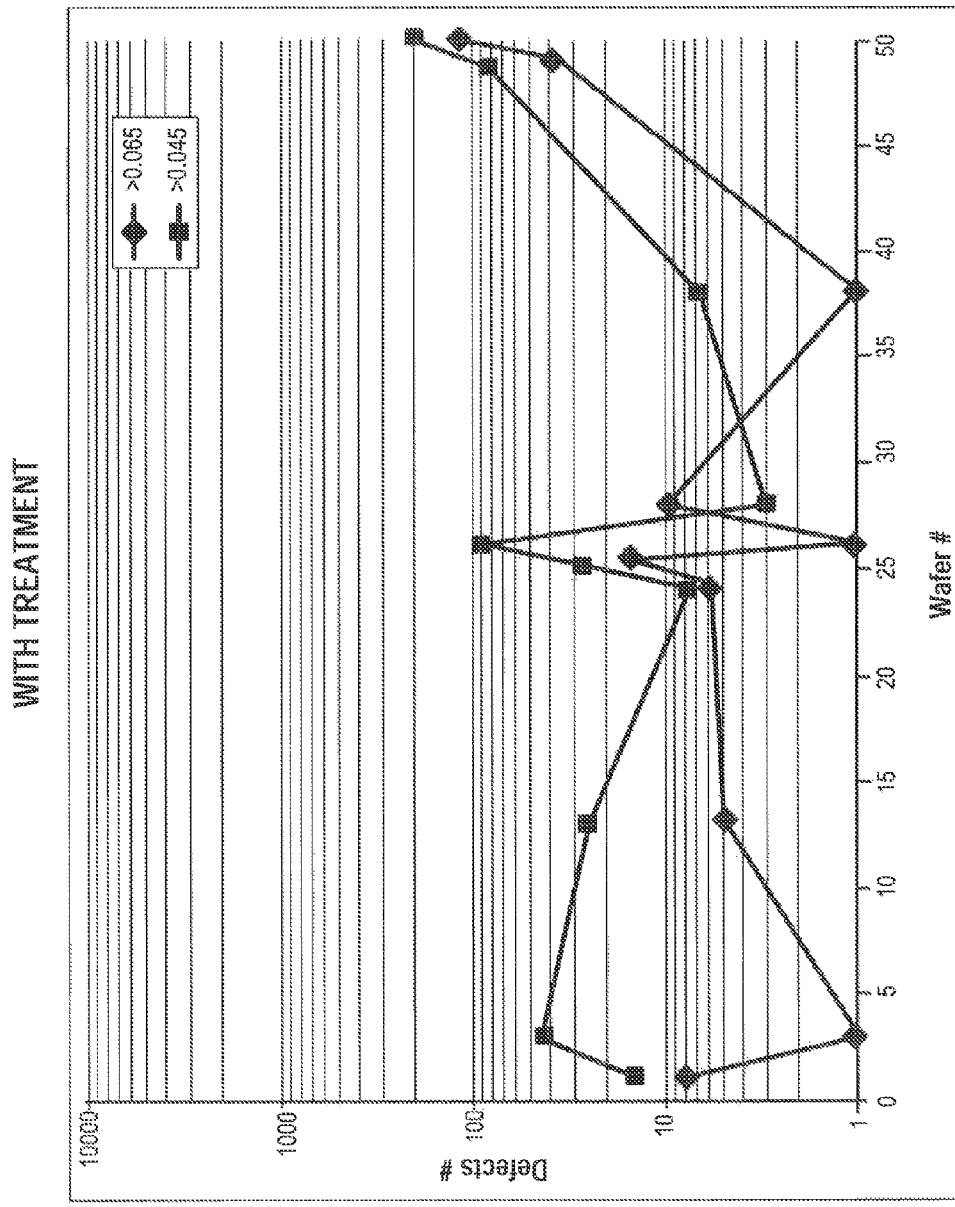
FIG. 5 illustrates a number of defects on a substrate based on a number of substrates processed using the treatment described herein.

FIGS. 4 and 5 illustrate a number of defects counted on a particle meter on a surface of a substrate when a reactor is not treated (FIG. 4) and when the reactor is treated (FIG. 5) in accordance with method 200, with ammonia as the treatment reactant chemistry, under the conditions noted above.

Figure 3:
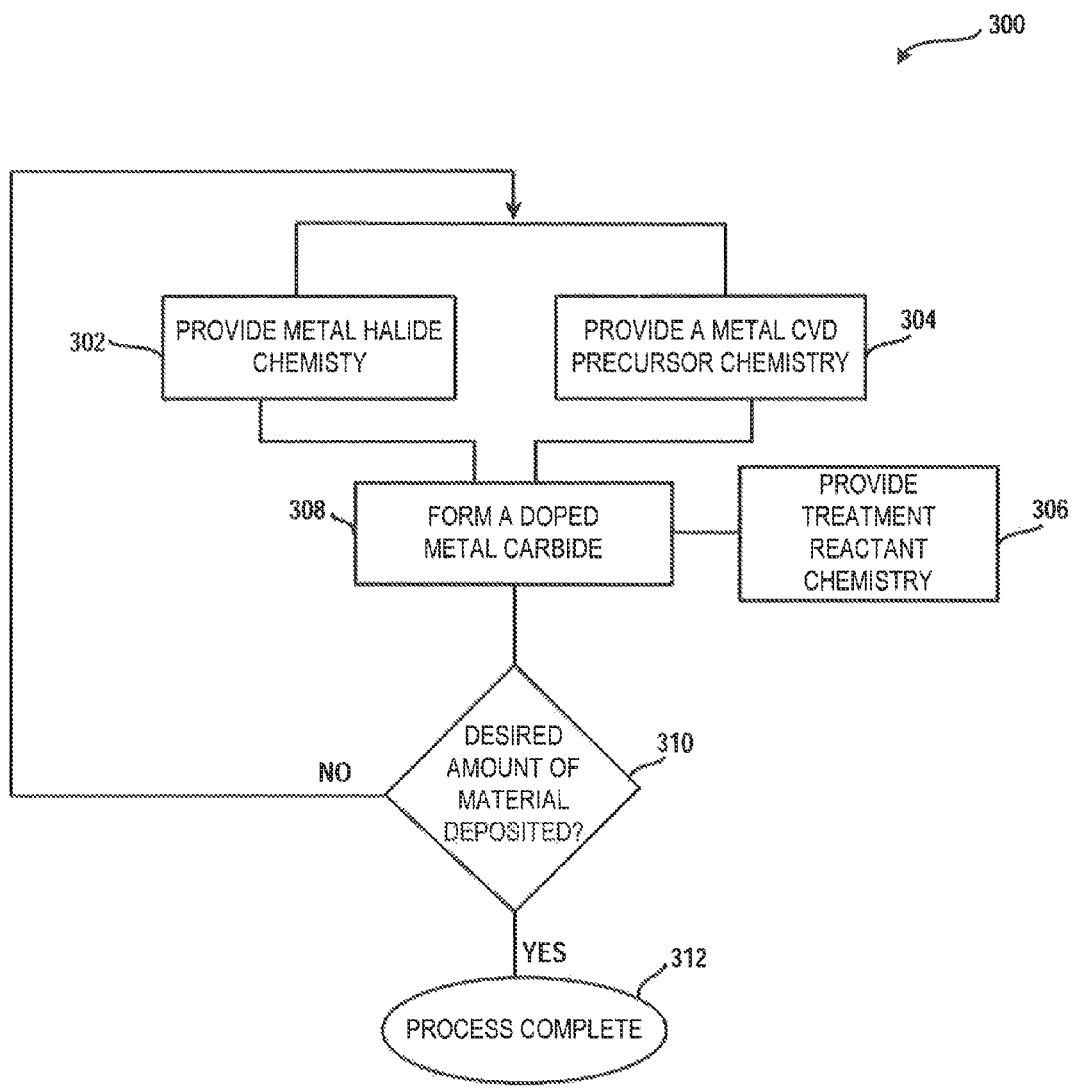
FIG. 3 illustrates another method in accordance with exemplary embodiments of the disclosure.

FIG. 3 illustrates another method 300 in accordance with additional exemplary embodiments of the disclosure. Method 300 includes the steps of providing a metal halide chemistry (step 302), providing a metal CVD precursor chemistry (step 304), providing treatment reactant chemistry (step 306), forming a doped metal film (step 308), determining whether a desired amount of material has been deposited (step 310) and completing the process (step 312) if a desired amount of material has been deposited and repeating steps 302-310 if a desired amount of material has not been deposited. Although not illustrated, method 300 may include a purge step (similar to step 212) prior to step 312.

Steps 302 and 304 may be the same as steps 202 and 204, except, in accordance with exemplary aspects of these embodiments, step 302 is performed prior to step 304. And, in accordance with further aspects, step 306 is performed after step 302 and prior to or simultaneous with step 304. By way of example, a metal halide chemistry from a metal halide source may be introduced to a reaction chamber for a period of time (e.g., a pulse of about 800 ms) during step 302. Then, during step 306, a treatment reactant, such as hydrogen, activated hydrogen, silane, activated silane, ethylene, and/or activated ethylene is introduced to the reaction chamber for a period of time. After or during step 306, the metal CVD reactant chemistry is introduced to the reaction chamber—e.g., for about 3.5 sec. exposure—to form a doped metal film. Using a pulse of the treatment reactant chemistry during step 306, prior to or during step 304, is thought to reduce a number of halide-terminated species on a surface of deposited material and therefore reduce or eliminate residue formation.

Although exemplary embodiments of the present disclosure are set forth herein, it should be appreciated that the disclosure is not so limited. For example, although the system and method are described in connection with various specific chemistries, the disclosure is not necessarily limited to these chemistries. Various modifications, variations, and enhancements of the system and method set forth herein may be made without departing from the spirit and scope of the present disclosure.

What is claimed is:

1. A method of treating a deposition reactor, the method comprising the steps of:
   providing a metal halide chemistry, selected from the group consisting of titanium halides, tantalum halides, and niobium halides, to a reaction chamber of the deposition reactor;
   providing a metal CVD precursor selected from the group consisting of organometallic compound chemistry and aluminum CVD compound chemistry to the reaction chamber;
   forming a deposited doped metal film comprising one or more of B, C, Si N overlying a substrate;
   optionally removing the substrate;
   providing a treatment reactant chemistry to the reaction chamber;
   exposing the reaction chamber to the treatment reactant chemistry to mitigate formation of particles comprising decomposition products of the metal CVD precursor; and
   purging the reaction chamber.

2. The method of claim 1, wherein the step of providing a treatment reactant chemistry to the reaction chamber includes providing a reactant selected from one or more of the group consisting of hydrogen compounds including one or more hydrogen atoms and compounds including a halogen.

3. The method of claim 1, wherein the step of providing a treatment reactant chemistry comprises providing a compound selected from the group comprising ammonia, hydrogen, silane, methane, silicon hydrides, boron hydrides, halosilanes, haloboranes, alkenes, alkynes, and hydrazine and its derivatives.

4. The method of claim 1, wherein the step of providing a treatment reactant chemistry comprises providing ammonia to the reaction chamber.

5. The method of claim 1, wherein the step of providing a treatment reactant chemistry comprises providing a source of a decomposition product of a compound selected from the group consisting of organometallic compounds and aluminum CVD compounds.

6. The method of claim 1, further comprising the step of exposing a treatment reactant to a plasma.

7. The method of claim 1, further comprising the step of exposing a treatment reactant to thermal excitation.

8. A method of treating a deposition reactor, the method comprising the steps of:
provinding a metal halide chemistry, selected from the group consisting of titanium halides, tantalum halides, and niobium halides, to a reaction chamber for a period of time;
after the step of providing a metal halide chemistry to a reaction chamber for a period of time, providing a treatment reactant chemistry to the reaction chamber for a period of time; and
during or after providing a treatment reactant chemistry to the reaction chamber for a period of time, providing a metal CVD precursor chemistry to the reaction chamber to form a layer of doped metal,
wherein use of the treatment reactant chemistry mitigates particle formation in the reaction chamber.

9. The method of claim 8, wherein the step of providing a treatment reactant chemistry to the reaction chamber includes providing a reactant chemistry from a source selected from one or more of the group consisting of hydrogen compounds including one or more hydrogen atoms and compounds including a halogen.

10. The method of claim 8, wherein the step of providing a treatment reactant chemistry comprises providing a compound from a source selected from the group comprising ammonia, hydrogen, silane, methane, silicon hydrides, boron hydrides, halosilanes, haloboranes, alkenes, alkynes, and hydrazine and its derivatives.

11. The method of claim 8, wherein the step of providing a treatment reactant chemistry comprises providing activated hydrogen to the reaction chamber.

12. The method of claim 8, wherein the step of providing a treatment reactant chemistry comprises providing a source of a decomposition product of a compound selected from the group consisting of organometallic compounds and aluminum CVD compounds.

13. The method of claim 8, further comprising the step of exposing a treatment reactant to a plasma.

14. The method of claim 8, further comprising the step of exposing a treatment reactant to thermal excitation.

* * * * *